United States Patent [19]

Asada et al.

[11] Patent Number: 5,237,581
[45] Date of Patent: Aug. 17, 1993

[54] SEMICONDUCTOR MULTILAYER REFLECTOR AND LIGHT EMITTING DEVICE WITH THE SAME

[75] Inventors: Susumu Asada; Kaori Kurihara, both of Tokyo, Japan

[73] Assignee: NEC Corporation, Tokyo, Japan

[21] Appl. No.: 791,264

[22] Filed: Nov. 13, 1991

[30] Foreign Application Priority Data

Nov. 14, 1990 [JP] Japan .................................. 2-307647
Jan. 8, 1991 [JP] Japan .................................. 3-000644

[51] Int. Cl.[5] .............................................. H01S 3/19
[52] U.S. Cl. ........................................ 372/45; 257/98; 359/584; 372/96; 372/99
[58] Field of Search ...................... 372/99, 92, 45, 96; 359/580, 584, 586, 589; 257/79, 98

[56] References Cited

U.S. PATENT DOCUMENTS 5,012,486   4/1991   Luryi et al. ........................... 372/45

Primary Examiner—James W. Davie
Attorney, Agent, or Firm—Sughrue, Mion, Zinn, Macpeak & Seas

[57] ABSTRACT

A semiconductor multilayer reflector (Distributed Bragg Reflector) includes a plurality of first quarter-wavelength layers each having a high refractive index, a plurality of second quarter-wavelength layers each having a low refractive index, and high concentration impurity doping regions. The first and second layers are piled up alternately, and each of the doping regions is formed at a heterointerface between the first and second layer. In this structure, the width and the height of the potential barrier at the heterointerface becomes small, so that tunnel current flowing through the multilayer reflector is increased.

8 Claims, 7 Drawing Sheets

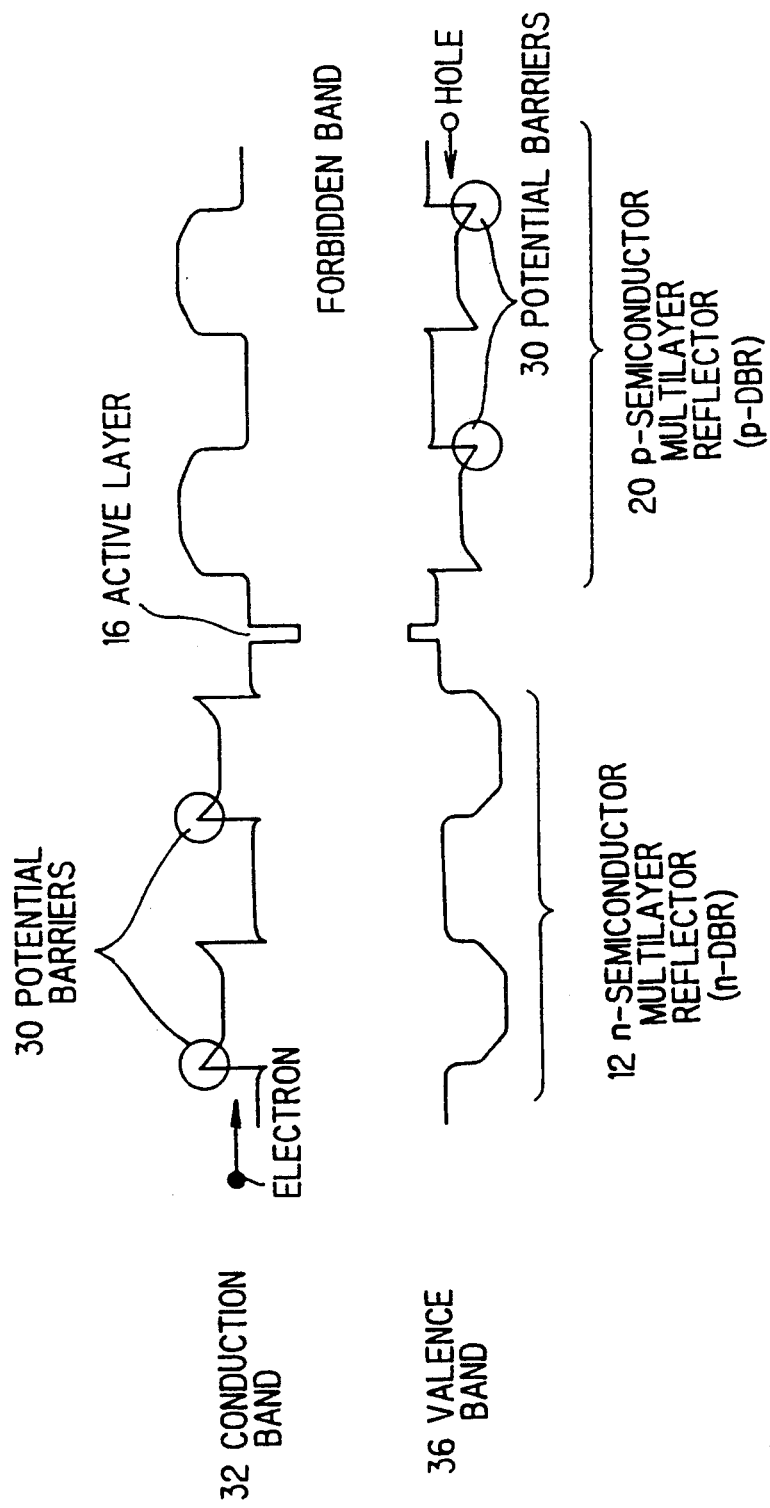

SEMICONDUCTOR MULTILAYER REFLECTOR AND LIGHT EMITTING DEVICE WITH THE SAME

FIELD OF THE INVENTION

This invention relates to a semiconductor multilayer reflector (Distributed Bragg Reflector, DBR), and a light emitting device using the semiconductor multilayer reflector, and more particularly, to a semiconductor multilayer reflector which is of two kinds of semiconductor materials each having a refractive index different from the other to be alternately layered, and a vertical cavity surface-emitting laser using the reflector.

BACKGROUND OF THE INVENTION

Recently, a vertical cavity surface-emitting laser including a semiconductor multilayer reflector (Distributed Bragg Reflector, DBR) is used in a parallel information processing system, a parallel optical communication system, etc.

A conventional semiconductor multilayer reflector (DBR) is composed of two kinds of semiconductor materials each having a different refractive index from the other to increase a reflection factor. That is, quarter-wavelength high and low refractive index layers are piled up alternately to provide the semiconductor multilayer reflector (DBR).

According to the conventional semiconductor multilayer reflector (DBR), energy band is not continuous in heterointerfaces, because energy bandgap is largely different between the high refractive index layer and the low refractive index layer, so that large potential barriers (spikes) occur on a conduction band in the heterointerfaces. Therefore, carrier flowing in the device is impeded by the potential barriers, so that serial resistance is increased.

Accordingly, some means for overcoming the above disadvantage are proposed. That is, the impurity is doped in the multilayer reflector to increase tunnel current by which the potential barriers is decreased. However, not only crystal is deteriorated by the high impurity doping, but also free carrier absorption increases. On the other hand, it is proposed that thin films of intermediate constitution are inserted in the heterointerfaces, and that graded layers are inserted in the heterointerfaces to decrease the potential barriers as described on pages 2496 to 2498 of "Appl Phys Lett 56 (25), Jun. 18, 1990". However, when the graded layers are formed, growing temperature is required to change in short cycle, so that the fabrication is complicated and the yield is decreased.

SUMMARY OF THE INVENTION

Accordingly, it is an object of the invention to provide a semiconductor multilayer reflector (DBR) and a light emitting device using the reflector (DBR) in which a serial resistance is low and a reflection factor is high.

According to the invention, a semiconductor multilayer reflector (DBR) includes:

a plurality of first quarter-wavelength layers each having a high refractive index;

a plurality of second quarter-wavelength second layers each having a low refractive index; and high concentration impurity doping regions;

wherein the first and second layers are provided alternately, and the doping region are positioned to be in contact with heterointerfaces between the first and second layers.

According to the invention, a light emitting device includes:

p and n type semiconductor multilayer reflectors (DBRs);

an active layer formed between the p and n type semiconductor multilayer reflectors (DBRs); and positive and negative electrodes which are connected with the p and n type semiconductor multilayer reflectors (DBRs) to be applied with a bias voltage, respectively;

wherein the p and n type semiconductor multilayer reflectors (DBRs) each comprises a plurality of first quarter wavelength layers each having a high refractive index, a plurality of second quarter-wavelength layers each having a low refractive index, and high concentration impurity doping regions;

the first and second layers are provided alternately, and each of the doping regions is formed at a heterointerface between the first and second layers.

BRIEF DESCRIPTION OF THE DRAWINGS

The invention will be explained in more detail in conjunction with appended drawing; wherein:

FIGS. 2, 3A and 3B are energy band diagrams according to the conventional light emitting device;

DESCRIPTION OF THE PREFERRED EMBODIMENTS

Figure 1:
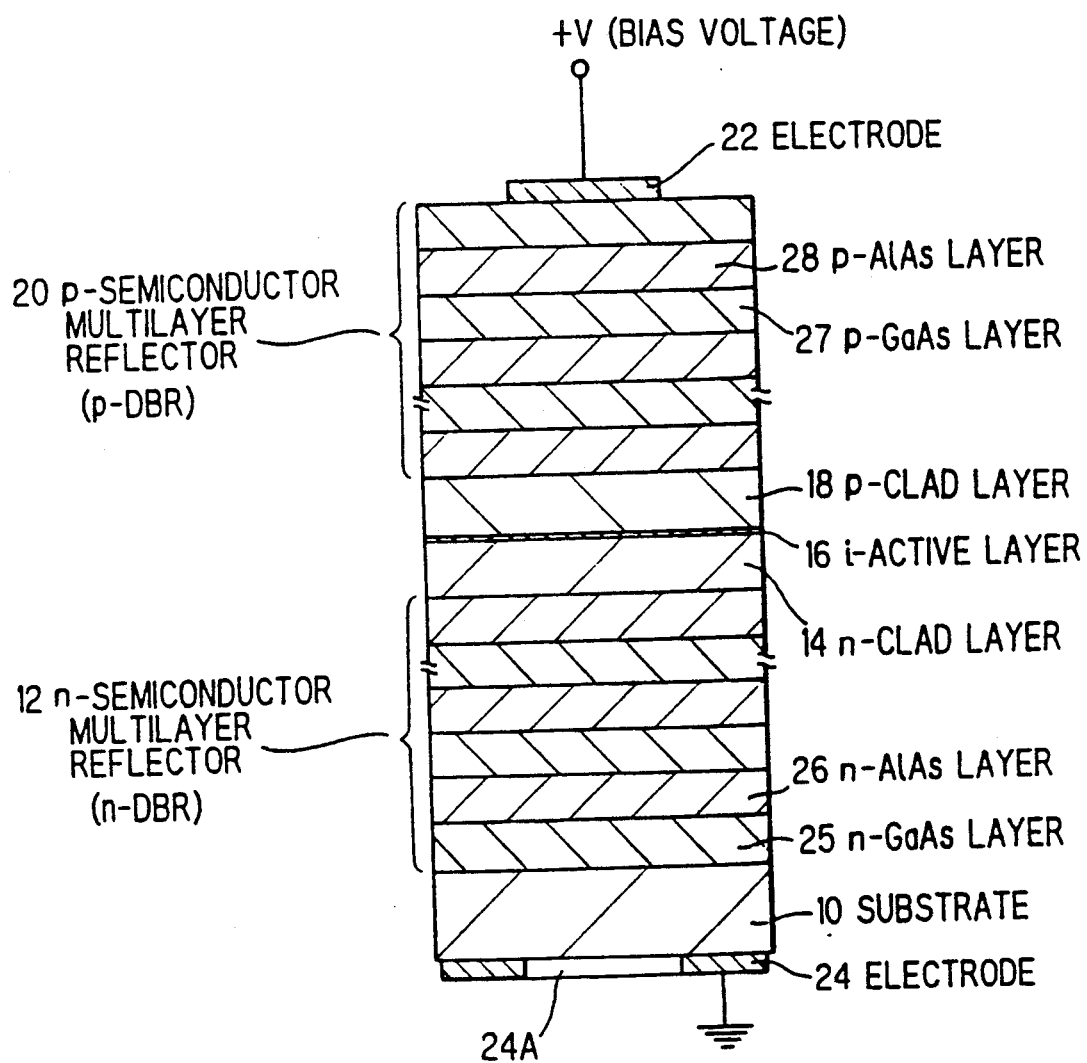
FIG. 1 is a sectional view showing a conventional light emitting device.

Before describing a semiconductor multilayer reflector (DBR) and a light emitting device according to the invention, a conventional light emitting device using the aforementioned conventional semiconductor multilayer reflector (DBR) will be explained in accordance with fabricating process in conjunction with FIG. 1.

At first, an n-semiconductor multilayer reflector (n-DBR) 12 is formed on a substrate 10 of n-GaAs, and an n-clad layer 14 of $Al_{0.3}Ga_{0.7}As$, an active layer 16 of $In_{0.2}Ga_{0.8}As$ and a p-clad layer 18 of $Al_{0.3}Ga_{0.7}As$ are grown successively on the n-semiconductor multilayer reflector (n-DBR) 12. Next, a p-semiconductor multilayer reflector (p-DBR) 20 is formed on the p-clad layer 18. After that, a p-electrode 22 of Au is formed on the p-semiconductor multilayer reflector (p-DBR) 20. And, an n-electrode 24 of AuGeNi is formed to have a window (not shown) for supplying light therethrough on the opposite surface of the substrate 10. Finally, the above fabricated structure is shaped to be cylindrical by etching.

The n-semiconductor multilayer reflector (n-DBR) 12 consists of plural pairs of quarter-wavelength n-GaAs (high refractive index) layers 25 and quarter-wavelength n-AlAs (low refractive index) layers 26 which are grown alternately. On the other hand, the p-semiconductor multilayer reflector (p-DBR) 20 consists of plural pairs of quarter-wavelength p-GaAs (high refractive index) layers 27 and quarter-wavelength p-AlAs (low refractive index) layers 28 which are grown alternately.

In the conventional light emitting device, when a bias voltage is applied between the p-and n-electrodes 22 and 24, amplified light is emitted from the active layer 16.

Figure 3A:
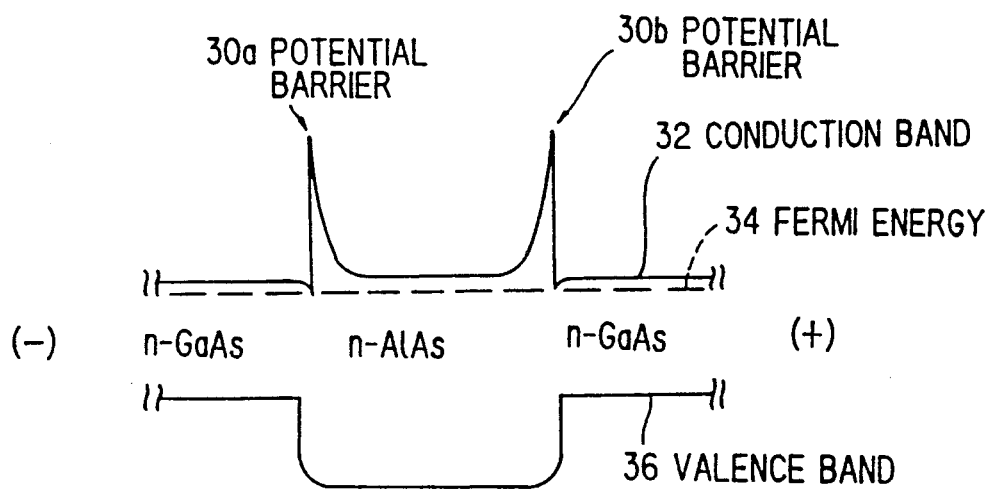

FIG. 2 shows an energy-band diagram on zero-bias condition, and FIG. 3A shows more detail of the energy-band diagram of the n-semiconductor multilayer reflector (n-DBR) 12. In these figures, reference numbers 32, 34 and 36 indicate a conduction band level, a Fermi energy level, and a valence band level, respectively. In the conventional light emitting device, potential barriers 30 (30a, 30b) occur on the conduction band 32 in the heterointerfaces, because band gap is largely different between the GaAs layer 25 and the AlAs layer 26.

Figure 3B:
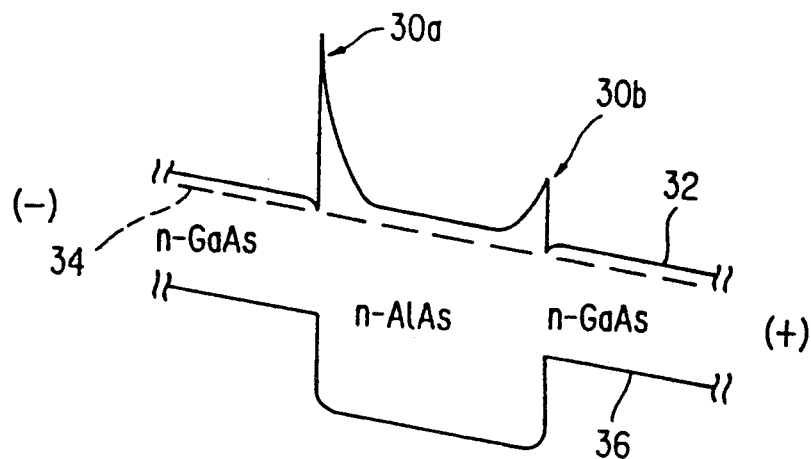

FIG. 3B shows the energy-band diagram on bias condition. The potential barrier 30a is grown on the negative bias side ((−) electrical side). The level of the potential barrier 30a depends on difference of electron affinity between the GaAs layer 25 and the AlAs layer 26 and level of the bias voltage, and the width of the potential barrier 30a depends on doping concentration and dielectric constant of the layers 25 and 26 on the both sides of the interface. For instance, when the doping concentration is $1.5 \times 10^{17}$ cm$^{-3}$ and the bias voltage is 0 V, the width of the potential barrier becomes about 200 Å.

The potential barriers 30 (30a, 30b) impede carriers flowing in the reflector (n-DBR) 12 and result in a large series resistance. Therefore, voltage drop occurs in carrier depletion regions of heterointerfaces, so that it is difficult to drive the light emitting device by a small bias voltage.

The p-semiconductor multilayer reflector (p-DBR) 20 is almost identical in energy band characteristic to the n-semiconductor multilayer reflector (n-DBR) 12 shown in FIGS. 3A and 3B, so that its explanation is omitted.

Next, a first preferred embodiment according to the invention will be explained in accordance with fabrication process in conjunction with FIG. 4.

At first, an n-semiconductor multilayer reflector (n-DBR) 12 is formed on a substrate 10 of n-GaAs, and an n-clad layer 14 of Al$_{0.3}$Ga$_{0.7}$As for phase control, an active layer 16 of In$_{0.2}$Ga$_{0.8}$As having a thickness of 100 Å and a p-clad layer 18 of Al$_{0.3}$Ga$_{0.7}$As for phase control are grown successively on the n-semiconductor multilayer reflector (n-DBR) 12. n-semiconductor multilayer reflector (n-DBR) 12 consists of 20 pairs of quarter-wavelength n-GaAs (high refractive index) layers 25 and quarter-wavelength n-AlAs (low refractive index) layers 26 which are grown alternately. In this process, n-impurity doping regions 50 having a high concentration of $1 \times 10^{13}$ cm$^{-2}$ and a delta functional width of several atoms (20 Å) are formed under the respective n-AlAs layers 26 by molecular beam epitaxy (MBE) method. The doping regions 50 are formed to have 20 Å distance from heterointerfaces, respectively.

Next, a p-semiconductor multilayer reflector (p-DBR) 20 is formed on the p-clad layer 18. The p-semiconductor multilayer reflector (p-DBR) 20 consists of 15 pairs of quarter-wavelength p-GaAs (high refractive index) layers 27 quarter-wavelength p-AlAs (low refractive index) layers 28 which are grown alternately. In this process, p-impurity doping regions 52 having a high concentration of $1 \times 10^{13}$ cm$^{-2}$ and a delta functional width of several atoms (20 Å) are formed above the respective p-AlAs layers 28 by molecular beam epitaxy (MBE) method. The doping regions 52 formed to have 20 Å distance from heterointerfaces, respectively.

After that, a p-electrode 22 of Au is formed on the p-semiconductor multilayer reflector (p-DBR) 20. And, an n-electrode 24 of AuGeNi is formed to have a window 24A for supplying light therethrough, on the opposite surface of the substrate 10. Finally, the above fabricated structure is shaped to be cylindrical by etching. In this structure, "quarter-wavelength" defines a thickness of the layers equal to one fourth of a wavelength of light propagating through the layers.

In operation, when a bias voltage is applied between the p-and n-electrodes 22 and 24, amplified light is emitted from the active layer 16.

Figure 5:
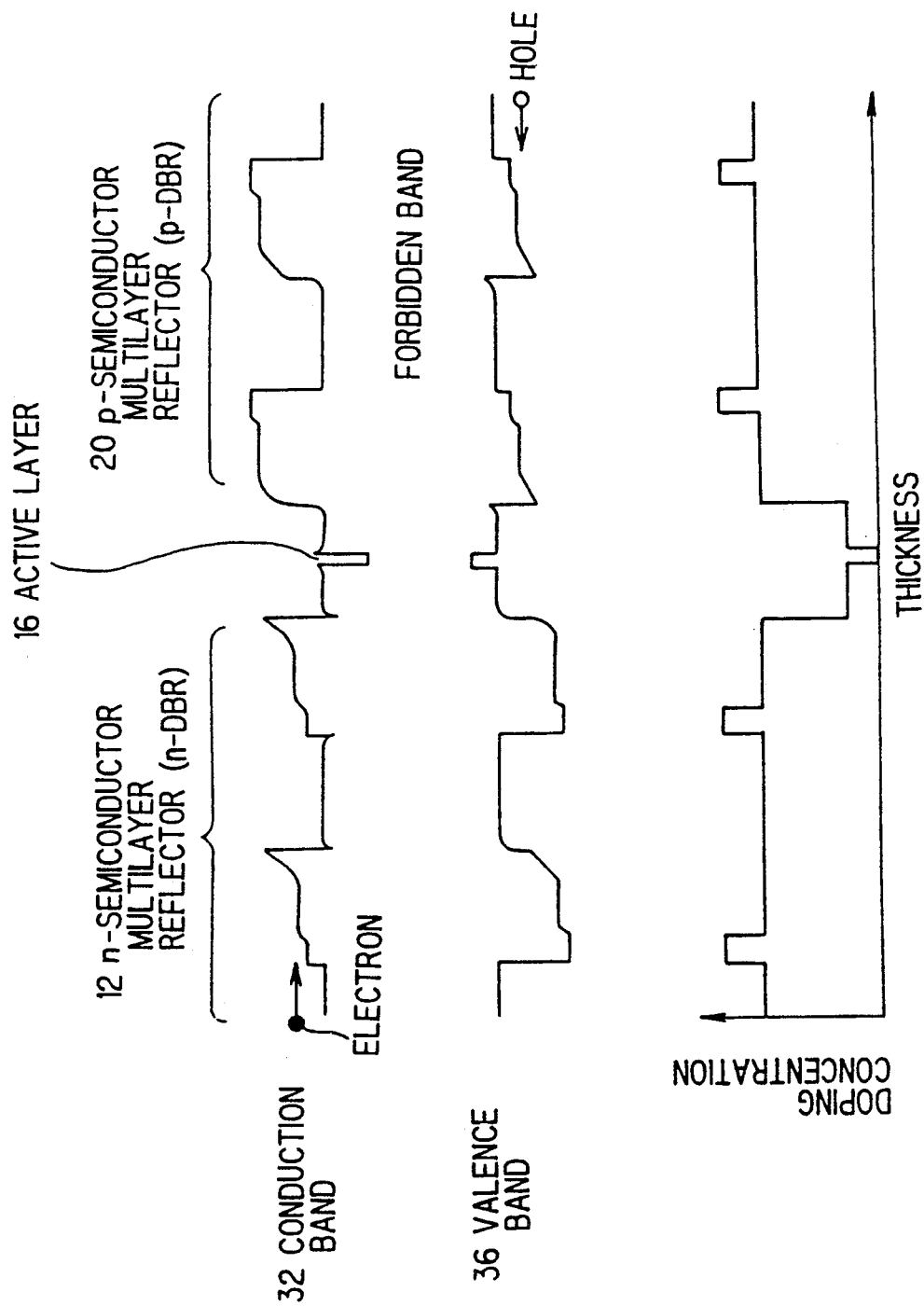
FIGS. 5, 6A and 6B are energy band diagrams of the preferred embodiment according to the invention.
Figure 6A:
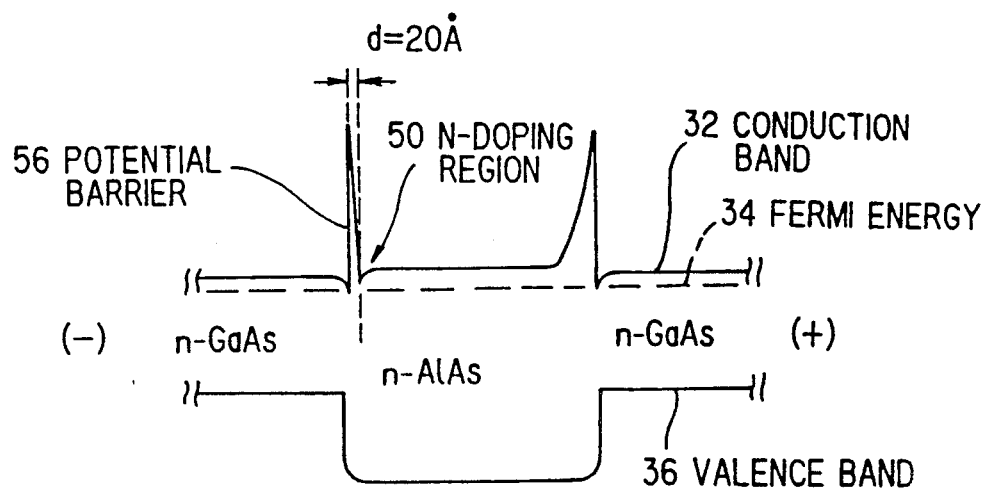
Figure 6B:
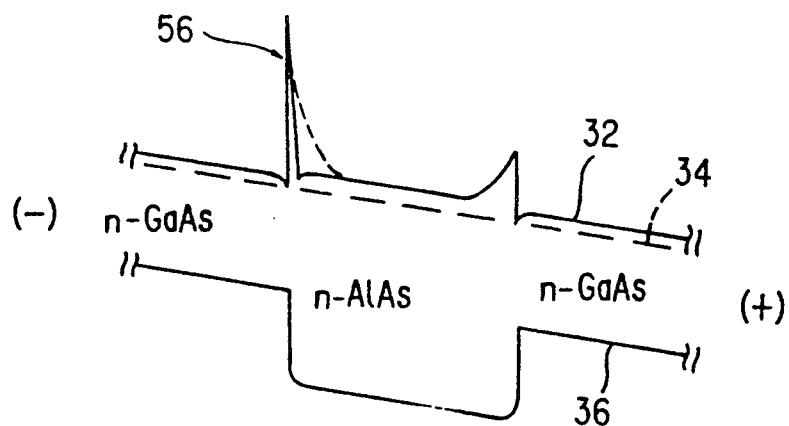

FIG. 5 is an energy-band diagram depending on doping concentration on zero-bias condition, FIG. 6A shows more detail of the energy-band diagram of the n-semiconductor multilayer reflector (n-DBR) 12, and FIG. 6B shows the energy-band diagram on bias condition. In these figures, reference numbers 32, 34 and 36 indicate a conduction band level, a Fermi energy level, and a valence band level, respectively.

According to the first preferred embodiment, a potential barrier 56 on the conduction band 32 at a heterointerface has a width "d" of only 20 Å, because the doping region 50 is formed at the heterointerface.

Therefore, tunnel current flowing through the multilayer reflectors (DBRs) 12 and 20 is increased, so that a serial resistance is much decreased, for instance two figures, in comparison with the conventional light emitting device in which impurity is doped uniformity in the multilayer reflectors (DBRs). As the result, the light emitting device can be driven by small bias voltage.

Figure 4:
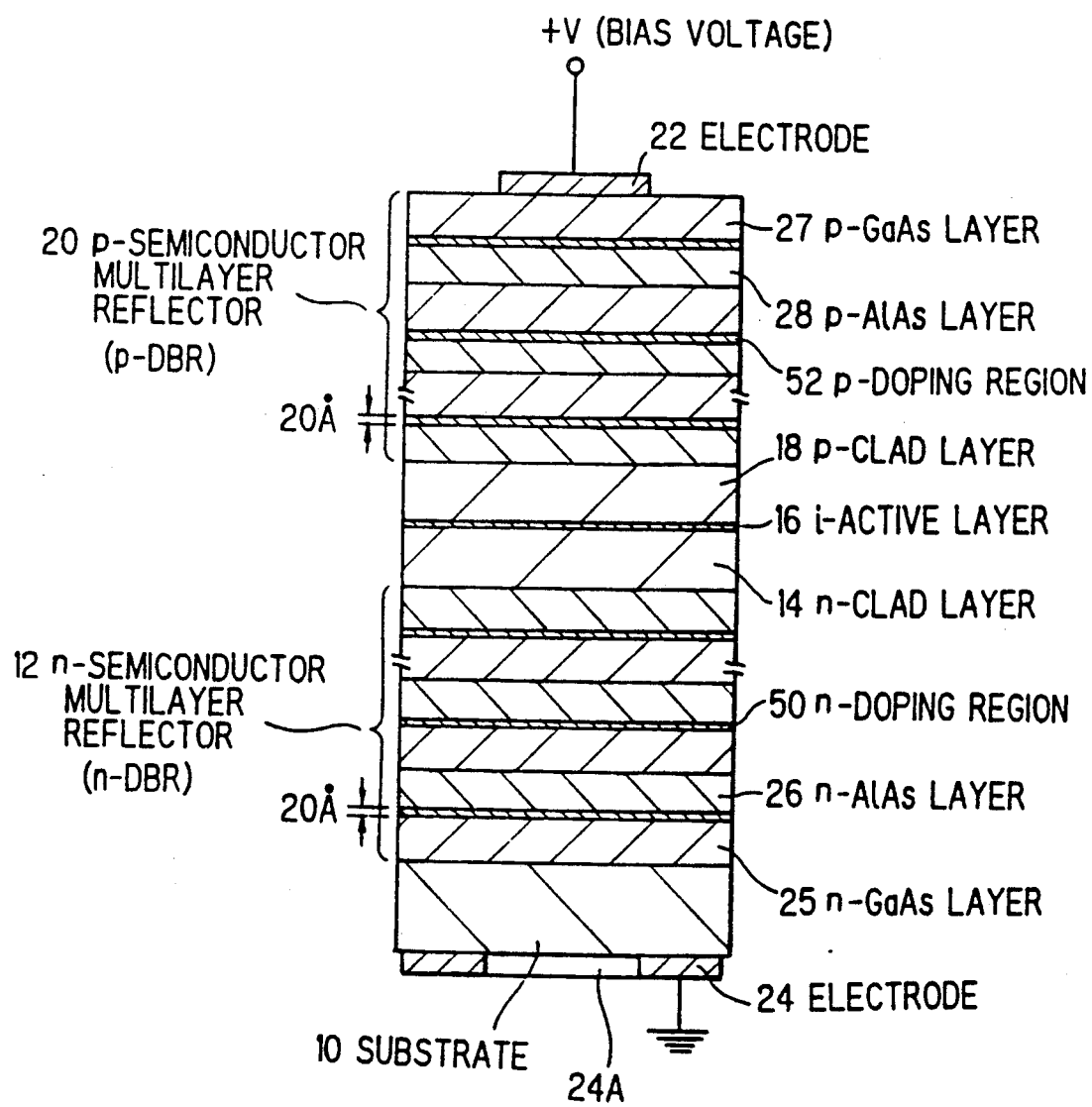
FIG. 4 is a sectional view showing a light emitting device of a first preferred embodiment according to the invention.
Figure 7:
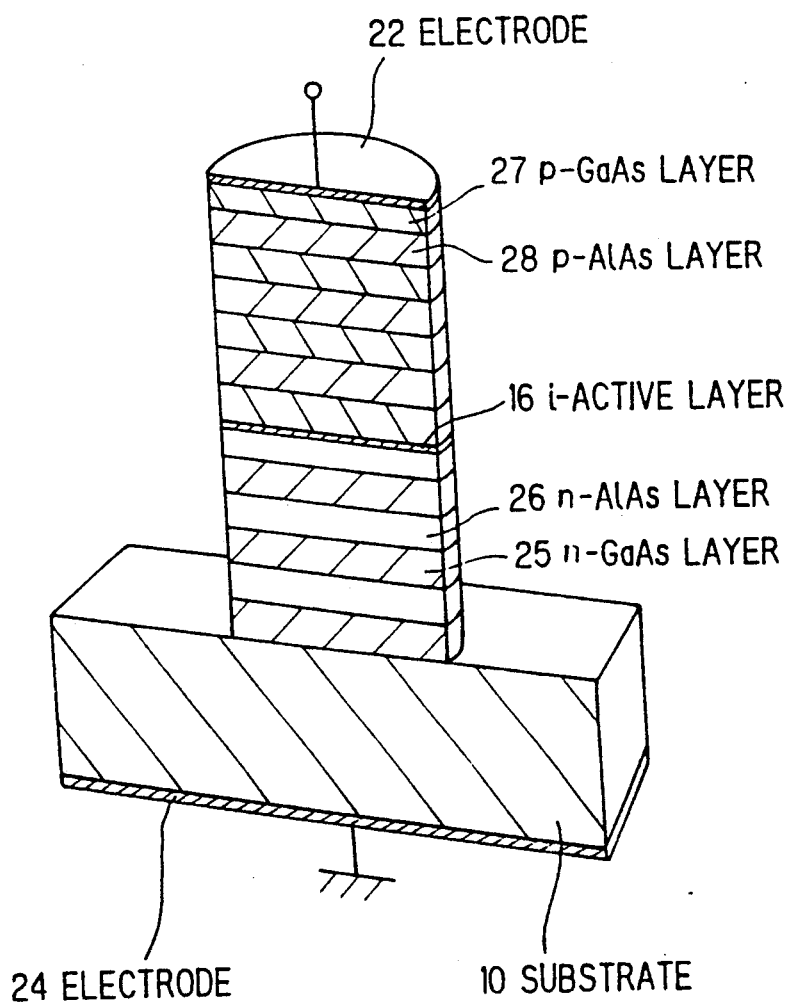
FIG. 7 is a perspective view showing a light emitting device of a second preferred embodiment according to the invention.

FIG. 7 shows a light emitting device of a second preferred embodiment according to the invention, wherein like parts are indicated by like reference numerals as used in FIG. 4.

As understood from the illustration, the light emitting device is of a mesa type having a cylindrical structure provided on the substrate 10 which is fabricated by etching the structure of FIG. 4.

In this mesa type light emitting device, current flowing through the device is more converged to provide a higher efficiency than in the planar type light emitting device of FIG. 4. In the light emitting device, the n-electrode 24 is not provided with a window. In the practical use, such a window may be provided in either one of the p-and n-electrodes 22 and 24.

Although the invention has been described with respect to specific embodiment for complete and clear disclosure, the appended claims are not to be thus limited but are to be construed as embodying all modification and alternative constructions that may occur to one skilled in the art which fairly fall within the basic teaching herein set forth. For example, the distance between the doping regions (50 and 52) and the heterointerfaces is not only limited by 20Å, but it may be 0 to 100Å distance. Further, the impurity doping regions 50 and 52 are formed in the both reflectors 12 and 20 in the above embodiments, however, the doping regions may be formed in one of the reflectors. And, the doping regions may be formed in part of the reflector. Furthermore, the semiconductor multilayer reflector according to the invention is applicable not only to a surface-emitting laser, but also to other light emitting devices, such as a super-radiant type LED, PNPN-surface emitting device and switching device, etc.

What is claimed is:

1. A semiconductor multilayer reflector (Distributed Bragg Reflector, DBR) comprising:
   a plurality of first quarter-wavelength layers each having a high refractive index;
   a plurality of second quarter-wavelength second layers each having a low refractive index;
   high concentration impurity doping regions;
   a substrate on which said first and second layers, and said doping regions are formed; and
   means for applying an electric field across said first and second layers, said doping regions, and said substrate;
   wherein said first and second layers are provided alternately, and said doping regions are positioned to be in contact with heterointerfaces between said first and second layers.

2. A semiconductor multilayer reflector (DBR), according to claim 1, wherein:
   said first and second layers are of n type semiconductor material, and said doping regions are formed on a negative bias voltage side of said second layers.

3. A semiconductor multilayer reflector (DBR), according to claim 1, wherein:
   said first and second layers are of p type semiconductor material, and said doping regions are formed on a positive side of bias voltage said second layers.

4. A semiconductor multilayer reflector (DBR), according to claim 1, wherein:
   said impurity doping regions are formed to have a width of several atom layers in delta function.

5. A light emitting device comprising:
   p and n type semiconductor multilayer reflectors (DBRs);
   an active layer formed between said p and n type semiconductor multilayer reflectors (DBRs); and
   positive and negative electrodes which are connected with said p and n type semiconductor multilayer reflectors (DBRs) to be applied with a bias voltage, respectively;
   wherein said p and n type semiconductor multilayer reflectors (DBRs) each comprises a plurality of first quarter-wavelength layers each having a high refractive index, a plurality of second quarter-wavelength layers each having a low refractive index, and high concentration impurity doping regions;
   said first and second layers are provided alternately, and each of said doping regions is formed at a heterointerface between said first and second layers.

6. A light emitting device, according to claim 5, wherein:
   said first and second layers are of n type semiconductor material, and said doping regions are formed on a negative side of said second layers relative to a bias voltage.

7. A light emitting device, according to claim 5, wherein:
   said first and second layers are of p type semiconductor material, and said doping regions are formed on a positive side of said second layers relative to bias voltage.

8. A light emitting device, according to claim 7, wherein:
   said impurity doping regions are formed to have a width of several atom layers in delta function.

* * * * *